United States Patent [19]
Darling, Jr.

[11] Patent Number: 5,923,174
[45] Date of Patent: Jul. 13, 1999

[54] DEVICE FOR MEASURING ELECTROMAGNETIC RADIATION ABSORPTION

[75] Inventor: Phillip Hiram Darling, Jr., Fullerton, Calif.

[73] Assignee: Northrop Grumman Corporation, Los Angeles, Calif.

[21] Appl. No.: 08/865,751

[22] Filed: May 30, 1997

[51] Int. Cl.⁶ .................................................. G01R 27/32
[52] U.S. Cl. .......................................... 324/637; 324/642
[58] Field of Search .................................... 324/642, 643, 324/637, 537, 158.1

[56] References Cited

U.S. PATENT DOCUMENTS

| | | | |
|---|---|---|---|
| 4,492,915 | 1/1985 | Caspers | 324/58.5 R |
| 4,634,291 | 1/1987 | Bantel et al. | 374/7 |
| 5,065,103 | 11/1991 | Slinkman | 324/158.1 |
| 5,317,081 | 5/1994 | Gelorme et al. | 528/353 |
| 5,393,557 | 2/1995 | Darling, Jr. | 427/10 |
| 5,574,379 | 11/1996 | Darling, Jr. | 324/642 |

*Primary Examiner*—Maura Regan
*Attorney, Agent, or Firm*—Terry J. Anderson; Karl J. Hoch, Jr.

[57] ABSTRACT

A device for measuring electromagnetic radiation absorption of a test surface includes an electromagnetic transceiver, an x-y axis positioning mechanism, and a z axis positioning mechanism. The x-y axis positioning mechanism facilitates mapping of electromagnetic radiation absorption at different locations upon the test surface and the z axis positioning mechanism enhances the accuracy of electromagnetic radiation measurements by facilitating phase matching of electromagnetic radiation transmitted by the electromagnetic transceiver with electromagnetic radiation received thereby.

10 Claims, 2 Drawing Sheets

1

DEVICE FOR MEASURING ELECTROMAGNETIC RADIATION ABSORPTION

FIELD OF THE INVENTION

The present invention relates generally to electronic measurement devices and more particularly to a device for measuring the electromagnetic radiation absorption of a test surface.

BACKGROUND OF THE INVENTION

Electromagnetic radiation absorbing surfaces are well known. Such electromagnetic radiation absorbing surfaces are utilized in electromagnetic radiation test cells such as those commonly used in electromagnetic compatibility (EMC) and electromagnetic interference (EMI) testing. They are also utilized in electromagnetic anechoic chambers for testing high-frequency radar, antennas, and in low observable structures. The increase in consumer electronics which broadcast electromagnetic radiation, such as cellular telephones and portable computers, has enhanced the need for techniques and materials which suppress stray electromagnetic radiation, particularly in airplanes and near airports so as to prevent interference with airport radar, communications, and automated landing systems. Buildings may incorporate such material to mitigate the intensity of unwanted electromagnetic radiation therein.

As will be appreciated by those skilled in the art, it is often necessary to measure the effectiveness of such electromagnetic absorbent materials. Thus, it is necessary to provide an accurate means for measuring the ability of a material to absorb electromagnetic radiation.

In this regard, it is known to position an electromagnetic transceiver proximate a test surface, radiate electromagnetic radiation from the transceiver to the test surface, and measure the electromagnetic radiation reflected therefrom. Of course, the intensity of the electromagnetic radiation reflected from the test surface will be inversely proportional to the ability of the test surface to absorb electromagnetic radiation.

However, such contemporary methodology suffers from inherent deficiencies. For example, frequently it is desirable to measure electromagnetic radiation absorption at various different locations (x-y positions) upon the test surface. It may be desirable to measure electromagnetic radiation absorption at one or more points upon the surface, along a line upon the surface, or at regularly spaced points defining an array upon the plane of the surface. In such instances it is frequently desirable to provide precise positioning of the electromagnetic transceiver, so as to accurately provide for electromagnetic radiation absorption measurements at the desired locations.

As those skilled in the art will further appreciate, it is also desirable to precisely position the electromagnetic transceiver vertically (along the z-axis thereof), so as to enhance the accuracy of measurements made therewith. It is well known that the output of an electromagnetic transceiver varies substantially due to phase differences between the electromagnetic radiation transmitted and that received thereby. Destructive interference between the transmitted and received electromagnetic radiation causes variations in the measured intensity of the received electromagnetic radiation according to well known principles. As such, it is desirable to maintain a constant phase difference between the transmitted and reflected electromagnetic radiation. For example, since the output of the electromagnetic transceiver is maximum when the transmitted and reflected electromagnetic radiation are in phase, then it is frequently desirable to maintain such in-phase relationship between the transmitted and received electromagnetic radiation and thus enhance the accuracy of electromagnetic radiation absorption measurements.

SUMMARY OF THE INVENTION

The present invention specifically addresses and alleviates the above mentioned deficiencies associated with the prior art. More particularly, the present invention comprises a device for measuring electromagnetic radiation absorption of a test surface, the device comprising an electromagnetic transceiver, an x-y positioning mechanism for positioning the electromagnetic transceiver at a desired location of the test surface, and a z-axis positioning mechanism for positioning the electromagnetic transceiver at a desired height above the test surface.

The x-y axis positioning mechanism facilitates mapping of electromagnetic radiation absorption at different locations upon the test surface. The z-axis positioning mechanism enhances the accuracy of electromagnetic radiation measurements by facilitating phase matching of the electromagnetic radiation transmitted by the electromagnetic transceiver with the electromagnetic radiation received thereby.

The x-y axis positioning mechanism preferably comprises at least one, preferably two, trackballs. Each trackball contacts the test surface and provides a position output signal representative of a position of the electromagnetic transceiver.

The z-axis positioning mechanism preferably comprises a bi-directional linear actuator, preferably a bi-directional linear actuator comprising a stepper motor.

The present invention further comprises a device for measuring curvature of a test surface, the device comprising an electromagnetic transceiver, an x-y axis positioning mechanism for positioning the electromagnetic transceiver at a desired location of the test surface, a z axis positioning mechanism for positioning the electromagnetic transceiver at a desired height above the test surface, and a computing circuit for determining the curvature of the test surface based upon an intensity of electromagnetic radiation received by the electromagnetic transceiver.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

The device for measuring electromagnetic radiation absorption of the present invention is illustrated in FIGS. 1 through 3c which depict a presently preferred embodiment thereof.

Figure 1:
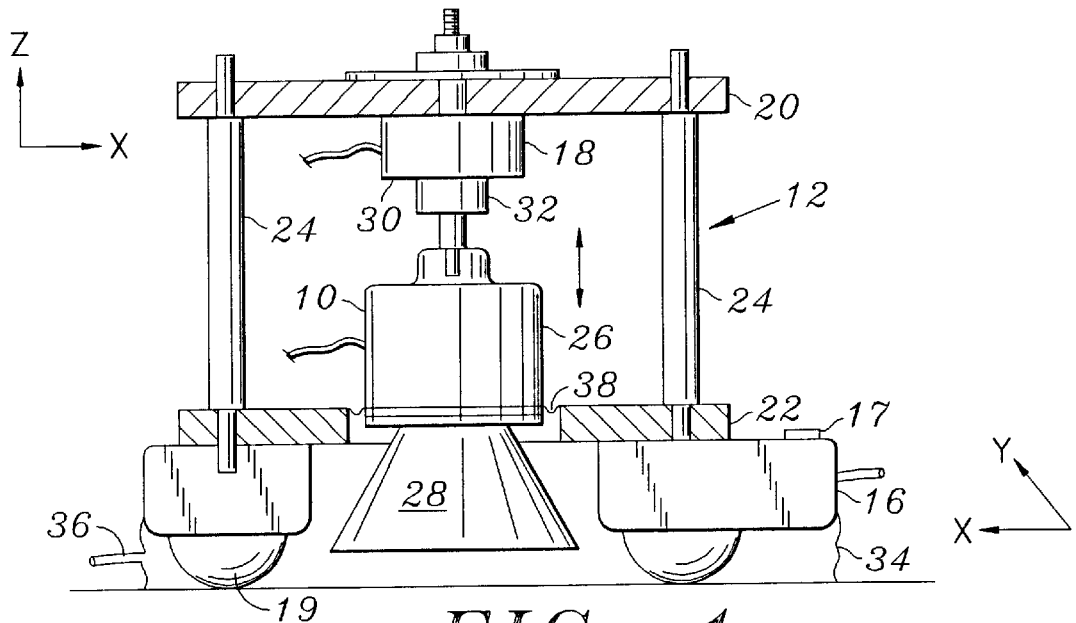
FIG. 1 is a front view of the device for measuring electromagnetic radiation absorption of the present invention.
Figure 2:
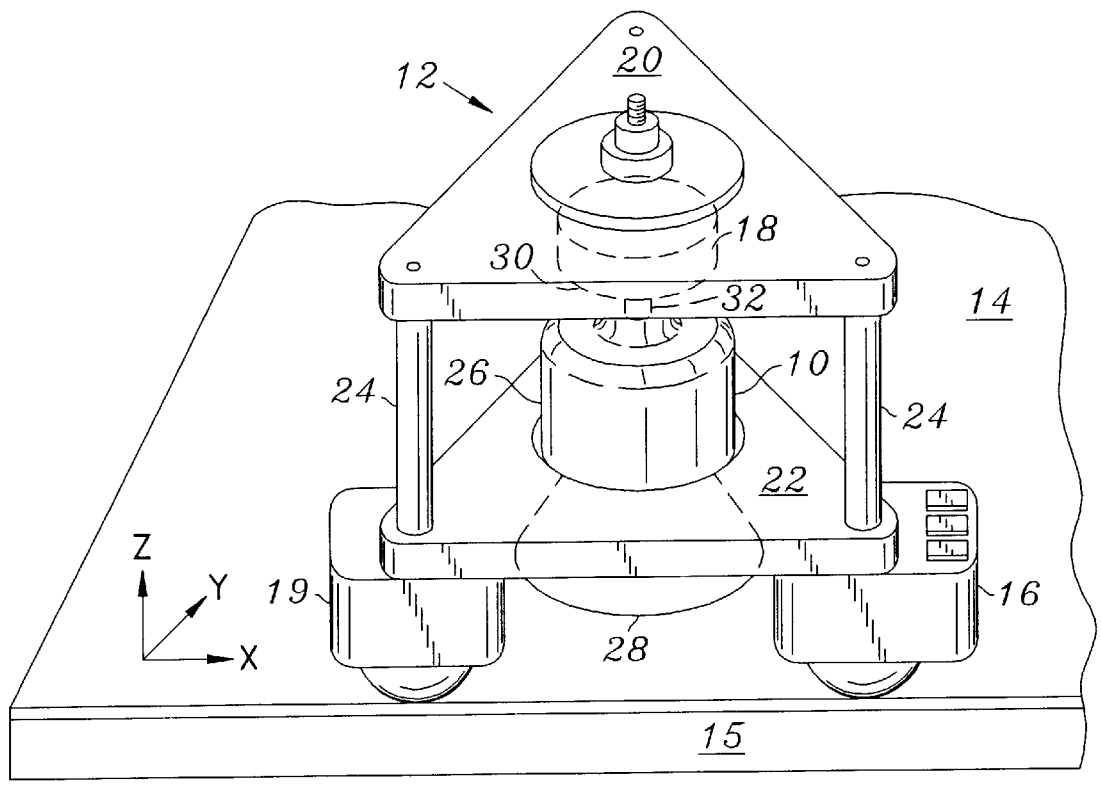
FIG. 2 is a perspective view of the device of FIG. 1 positioned upon a test surface.

Referring now to FIGS. 1 and 2, the present invention generally comprises an electromagnetic transceiver 10 which is mounted to a movable carriage 12 and is oriented so as to transmit electromagnetic radiation orthogonally toward the plane of a test surface 14 (FIG. 2). The test surface 14 may be supported by a support surface 15, if desired.

The carriage 12 is configured so as to move about over the test surface 14. The carriage 12 comprises at least one, preferably two, trackballs 16, which facilitate movement of the carriage 12 and which also provide x-y position indications of the carriage 12 in relation to the test surface 14.

As those skilled in the art will appreciate, the use of a single trackball 16 will provide a precise position indication of the electromagnetic transceiver 10 only as long as the carriage 12 maintains a given rotation, i.e., is not permitted to rotate as it is moved from position to position upon the test surface 14. If the carriage 12 is permitted to rotate, then two trackballs 16 are necessary in order to provide a precise position indication of the electromagnetic transceiver 10.

The carriage 12 preferably comprises three contact points, e.g., trackballs and/or ball transfers, with the test surface 14, so as to provide for the stable support of the carriage 12 by the test surface 14. Any contact points which do not comprise a trackball 16 preferably comprise a transfer ball type wheel 19. Those skilled in the art will appreciate that such contacts may alternatively comprise a caster or other type of wheel which facilitates movement of the carriage 12 in any desired direction. Further, the carriage 12 may alternatively comprise four or more contact points, if desired. The carriage 12 may alternatively comprise more than two trackballs and the position indications provided by each pair of trackballs then be averaged to enhance the accuracy thereof.

A z-axis positioning mechanism, preferably a linear actuator 18 facilitates vertical or z-axis positioning of the electromagnetic transceiver 10. As those skilled in the art will appreciate, the amplitude of the signal reflected by the test surface 14 and received by the electromagnetic transceiver 10 is at a maximum intensity when the electromagnetic transceiver 10 is positioned vertically such that the transmitted and received electromagnetic radiation are in phase with one another. By maintaining the received signal at its maximum level, more precise absorption measurements are facilitated. When the received signal is at its maximum level, then destructive interference between the transmitted and received signal is minimized, thus mitigating inaccuracies in the measurement process. As those skilled in the art will appreciate, such inaccuracies may occur, for example, when one measurement is taken with the transmitted and received signals in phase with one another and then a subsequent measurement is taken with the transmitted and received signals not in phase with one another.

More particularly, according to the preferred embodiment of the present invention, the carriage 12 comprises a top plate 20, a bottom plate 22 and three interconnecting vertical supports 24 which space the top plate 20 apart from the bottom plate 22.

The electromagnetic transceiver 10 comprises a transducer portion 26 and a wave guide or horn portion 28. The linear actuator 18 preferably comprises a bi-directional linear actuator comprising a stepper motor 30 having a lead screw shaft 32 extending from the bottom thereof and attached to the electromagnetic transceiver 10 such that vertical movement of the lead screw shaft 32 results in like vertical movement of the electromagnetic radiation transceiver 10.

Examples of bi-directional linear actuators which are suitable for use in the present invention are the Series 92200 Digital Linear Actuators manufactured by Airpax of Stamford, Conn. Airpax also manufactures the Series SAA1027 Stepper Motor IC Driver which is a single integrated circuit chip suitable for driving the bi-directional linear actuator. Those skilled in the art will appreciate that various other linear actuators and driver circuits are likewise suitable.

According to the preferred embodiment of the present invention, the linear actuator 18 has a linear travel per step or resolution of 0.001 inch (0.025 mm) to 0.003 inch (0.076 mm) and has a maximum travel of 0.875 inch (22.2 mm) to 2.5 inch (63.5 mm).

Examples of a trackball suitable for use in the present invention are the models T70X3 and T7XX0 manufactured by CTI Electronics Corporation of Stratford, Conn., both of which have a 1.5 inch diameter ball. According to an alternative configuration of the present invention, a vacuum skirt 34 provides a seal between the carriage 12 and the test surface 14, so as to prevent inadvertent movement of the carriage 12 as a measurement is being performed. Vacuum is applied to the vacuum skirt 34 via vacuum inlet 36. Further, such vacuum is particularly useful in maintaining desired positioning of the carriage 12 upon test surfaces which are not level, as well as upon sloped, vertical or upside down test surfaces. The present invention is preferably configured such that an ordinary shop vacuum cleaner can be utilized to apply sufficient vacuum to the carriage.

A diaphragm 38 provides for attachment of the electromagnetic radiation transceiver 10 to the bottom plate 22 of the carriage 12 in a manner which facilitates vertical movement of the electromagnetic radiation transceiver 10 and which also provides a vacuum seal between the electromagnetic transceiver 10 and the bottom plate 22, so as to facilitate use of the vacuum skirt.

Figure 3A:
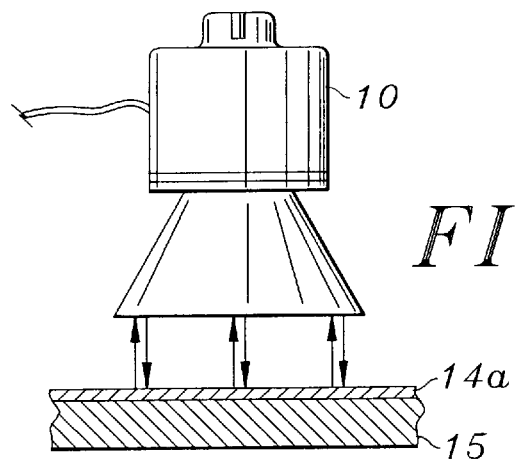
FIG. 3a shows an electromagnetic transceiver positioned above a flat surface.
Figure 3B:
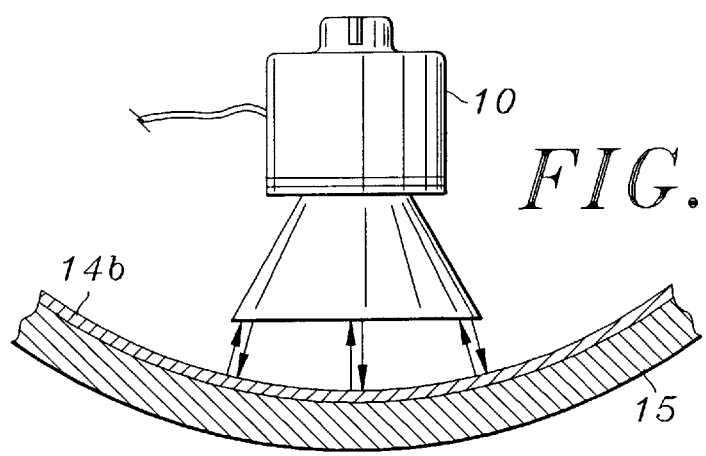
FIG. 3b shows an electromagnetic transceiver positioned above a concave surface.
Figure 3C:
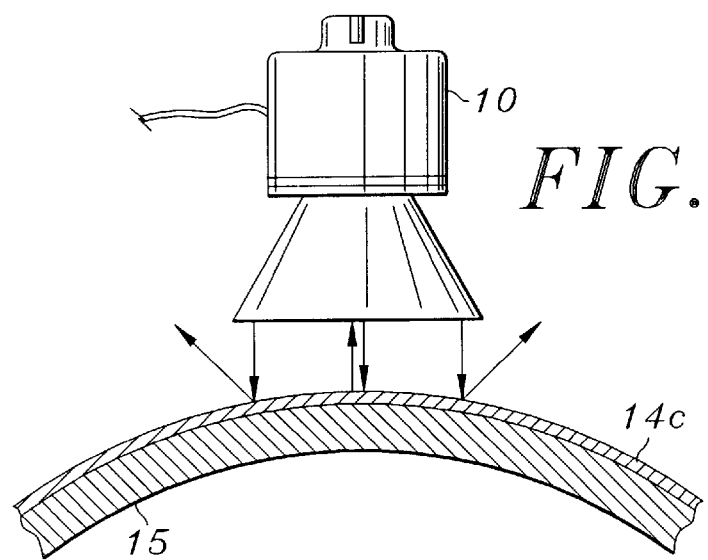
FIG. 3c shows an electromagnetic transceiver positioned above a convex surface.

Referring now to FIGS. 3a, 3b, and 3c, the operation of an electromagnetic transceiver 10 upon flat, concave, and convex surfaces, respectively, is shown.

With particular reference to FIG. 3a, when the electromagnetic transceiver 10 transmits electromagnetic radiation toward a substantially flat surface 142, then some of the electromagnetic radiation is reflected back to the electromagnetic transceiver 10 and some of the electromagnetic radiation is reflected away therefrom. Thus, the intensity of the electromagnetic radiation received by the electromagnetic transceiver 10 is substantially less than that transmitted thereby.

With particular reference to FIG. 3b, when the electromagnetic transceiver 10 radiates electromagnetic radiation toward a concave test surface 14b, then substantially all of the electromagnetic radiation is reflected back thereto. Thus, the intensity of the electromagnetic radiation received by the electromagnetic transceiver 10 is substantially equal to that transmitted thereby.

With particular reference to FIG. 3c, when the electromagnetic transceiver 10 transmits electromagnetic radiation toward a convex test surface 14c, then a large portion of the electromagnetic radiation is reflected away therefrom and only a comparatively small portion of the electromagnetic radiation is reflected back to the electromagnetic transceiver 10.

Thus, as is clearly shown in FIGS. 3a, 3b and 3c, the amount of electromagnetic radiation reflected back to an electromagnetic transceiver 10 is dependant upon the shape of the test surface. When the shape of a test surface is known, then a correction factor can be utilized to compensate for the increased or decreased electromagnetic radiation received by the transceiver 10, so as to facilitate the performance of accurate electromagnetic radiation absorption measurements therewith. If the curvature is not known, but the absorption characteristics of the test surface are known, then the present invention may be utilized to provide an indication of the degree of curvature of the test surface.

Having described the structure of the device for measuring electromagnetic radiation of the present invention, it may be beneficial to describe the operation and use thereof. In order to use the device for measuring electromagnetic radiation of the present invention, it is first placed upon a test surface at a desired initial location thereof. The location of the trackball(s) may be recorded or entered into a computer by depressing one of the buttons 17 of the trackball(s), which are preferably on top of the trackball 16. Alternatively, the position of the carriage 12 may be logged automatically each time a measurement is performed.

After establishing the desired position of the carriage 12, then the electromagnetic radiation transceiver 10 is energized and a measurement of the electromagnetic radiation reflected back thereto by the test surface 14 is made.

As those skilled in the art will appreciate, such test procedures typically comprise the measurement at either a single or multiple points, along a line, or at various, typically regularly spaced, points along the plane of the test surface 14. When multiple measurements are to be performed, then the carriage 12 is moved from one desired location to another, each time either automatically or manually, e.g., via the trackball button 17, causing the position information to be recorded.

Before each measurement is performed, the electromagnetic transceiver 10 is positioned vertically, i.e., along the z-axis thereof, so as to maximize the received electromagnetic radiation, thereby mitigating errors due to destructive interference between the transmitted and reflected electromagnetic radiation. Such desired vertical positioning of the electromagnetic transceiver 10 may either be performed manually, or automatically, i.e., under computer control, as desired. When performed manually, the user simply causes the transceiver 10 to move up or down while monitoring the intensity of the received signal. The device for measuring electromagnetic radiation of the present invention may be utilized to perform absorption measurements of curved surfaces, if the amount of curvature is known. When the amount of curvature is known, it is possible to correct the actual measurement so as to compensate for the decreased amount of electromagnetic radiation received due to convex curvature of the surface or the increased amount of electromagnetic radiation received due to concave curvature thereof. Such correction may be performed either manually or automatically, e.g., via a computer, as desired.

The present invention may also be utilized to measure the degree of curvature of a test surface, if the electromagnetic radiation absorption characteristics thereof are known. Thus, for example, the electromagnetic radiation absorption characteristics of a surface may be obtained by performing electromagnetic radiation absorption measurements upon a flat portion of a test surface, and then the amount of curvature of a curved portion of the test surface measured.

It is understood that the device for measuring electromagnetic radiation described herein and shown in the drawings represents only a presently preferred embodiment of the invention. Indeed, various modifications and additions may be made to such embodiment without departing from the spirit and scope of the invention. For example, the carriage may be of various different configurations. Various different shapes of the upper and lower plates is contemplated. The upper and lower plates may be generally circular, square, rectangular, octagonal, hexagonal, etc. and the carriage may comprise any desired number of wheels and/or trackballs. Additionally, movement of the carriage may be accomplished automatically, via one or more motors which are under computer control, if desired.

Alternatively, the actuator 18 and transceiver 10 may be mounted on the arm of a 3 axis positioning device to facilitate absorption measurements of three dimensional surfaces.

Thus, these and other modifications and additions may be obvious to those skilled in the art and may be implemented to adapt the present invention for use in a variety of different applications.

What is claimed is:

1. A device for measuring electromagnetic radiation absorption along different areas of a stationary test surface, the device comprising:
    a) a movable carriage supportable on the test surface;
    b) an electromagnetic transceiver disposed on the carriage, the electromagnetic transceiver configured to transmit and receive electromagnetic radiation from the stationary test surface and to determine the electromagnetic radiation absorption thereof;
    c) an x-y locating device disposed on the carriage, the x-y locating device configured to determine a position of the electromagnetic transceiver in an x-y plane of the test surface as the transceiver transmits and receives electromagnetic radiation; and
    d) a z axis positioning mechanism disposed on the carriage and mechanically coupled to the electromagnetic transceiver, the z axis positioning mechanism configured to position the electromagnetic transceiver at a variable height above the test surface to facilitate phase matching of the transmitted electromagnetic radiation with the received electromagnetic radiation in order to maximize the received electromagnetic radiation and minimize effects of destructive interference specific to a particular area of the test surface.

2. The device of claim 1 wherein the x-y locating device comprises at least one trackball configured to generate an output signal representative of the position of the electromagnetic transceiver.

3. The device of claim 1 wherein the x-y locating device comprises two trackballs, each of the trackballs configured to generate an output signal representative of the position of the electromagnetic transceiver.

4. The device of claim 1 wherein the z axis positioning mechanism comprises a bi-directional linear actuator.

5. The device of claim 1 wherein the z axis positioning mechanism comprises a bi-directional linear actuator having a stepper motor.

6. The device of claim 1 further comprising:

d) a computing circuit in communication with the electromagnetic transceiver, the computing circuit configured to determine a curvature of the test surface by comparing an intensity of the electromagnetic radiation received from the test surface to a reference level representative to the intensity of electromagnetic radiation received from a generally flat test surface.

7. A method for measuring electromagnetic radiation absorption of a stationary test surface with an electromagnetic transceiver disposed on a movable carriage, the method comprising the steps of:

a) placing the movable carriage on the test surface;

b) positioning an electromagnetic transceiver disposed upon the carriage adjacent to a first area of the test surface;

c) adjusting the vertical spacing of the electromagnetic transceiver from the test surface such that electromagnetic radiation transmitted and received by the electromagnetic transceiver are substantially in phase with one another in order to maximize the received electromagnetic radiation and minimize destructive interference associated with the first area of the test surface; and d) measuring a difference between the intensity of the transmitted electromagnetic radiation and the intensity of the received electromagnetic radiation to determine the electromagnetic radiation absorption of the first area of the test surface.

8. The method of claim 7 wherein step (b) further comprises determining the location of the electromagnetic transceiver with at least one trackball.

9. The method of claim 7 wherein step (c) further comprises positioning the electromagnetic transceiver with a bi-directional linear actuator.

10. The method of claim 7 further comprising the steps of:

e) moving the carriage to a second area of the test surface;

f) adjusting the vertical spacing of the electromagnetic transceiver from the second area of the test surface such that electromagnetic radiation transmitted and received by the electromagnetic transceiver are substantially in phase with one another in order to maximize the received electromagnetic radiation and minimize destructive interference associated with the second area of the test surface; and g) measuring the difference between the intensity of the transmitted electromagnetic radiation and the intensity of the received electromagnetic radiation in order to map the electromagnetic radiation absorption of the second area of the test surface.

* * * * *